United States Patent
Eshraghi et al.

(10) Patent No.: US 9,559,203 B2
(45) Date of Patent: Jan. 31, 2017

(54) MODULAR APPROACH FOR REDUCING FLICKER NOISE OF MOSFETS

(71) Applicant: ANALOG DEVICES, INC., Norwood, MA (US)

(72) Inventors: Ali Eshraghi, Los Gatos, CA (US); Alfredo Tomasini, San Jose, CA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 13/942,471

(22) Filed: Jul. 15, 2013

(65) Prior Publication Data

US 2015/0015337 A1    Jan. 15, 2015

(51) Int. Cl.
| | |
|---|---|
| *H01L 29/66* | (2006.01) |
| *H03F 1/26* | (2006.01) |
| *H01L 29/78* | (2006.01) |
| *H01L 21/8234* | (2006.01) |
| *H01L 21/8238* | (2006.01) |
| *H01L 29/10* | (2006.01) |

(52) U.S. Cl.
CPC ... *H01L 29/7838* (2013.01); *H01L 21/823412* (2013.01); *H01L 21/823807* (2013.01); *H01L 29/1041* (2013.01); *H01L 29/66537* (2013.01); *H01L 29/78* (2013.01); *H03F 1/26* (2013.01)

(58) Field of Classification Search
CPC ............ H01L 21/28202; H01L 21/26506; H01L 29/518; H01L 21/28238; H01L 21/823857; H01L 21/2822
USPC ........ 438/287, 283, 766, 786, 770; 257/305, 257/365, E21.335, E21.639, E21.135, 257/E21.435, E21.703, E27.112, E29.264; 327/355; 330/255
See application file for complete search history.

(56) References Cited

U.S. PATENT DOCUMENTS

| | | | | |
|---|---|---|---|---|
| 5,545,579 A | * | 8/1996 | Liang et al. ............. | 438/291 |
| 5,885,874 A | * | 3/1999 | Gardner ................... | 438/289 |
| 7,176,530 B1 | | 2/2007 | Bulucea et al. | |
| 2003/0025165 A1 | * | 2/2003 | Kim et al. ............... | 257/369 |
| 2008/0042696 A1 | * | 2/2008 | Redoute et al. ......... | 327/108 |

(Continued)

FOREIGN PATENT DOCUMENTS

| | | | | |
|---|---|---|---|---|
| JP | 05-217579 | * | 1/1993 | ............ H01L 29/78 |
| JP | H7-74351 | | 3/1995 | |

(Continued)

OTHER PUBLICATIONS

European Extended Patent Search Report in EP Application Serial No. 14175480.4 mailed Nov. 21, 2014, 7 pages.

(Continued)

*Primary Examiner* — Thomas L Dickey
*Assistant Examiner* — Changhyun Yi
(74) *Attorney, Agent, or Firm* — Patent Capital Group (57) ABSTRACT

In one example implementation, the present disclosure provides a modular approach to reducing flicker noise in metal-oxide semiconductor field-effect transistors (MOSFETs) in a device. First, a circuit designer may select one or more surface channel MOSFETs in a device. Then, the one or more surface channel MOSFETs are converted to one or more buried channel MOSFETs to reduce flicker noise. One or more masks may be applied to the channel(s) of the one or more surface channel MOSFETs. The technique maybe used at the input(s) of operational amplifiers, and more particularly, rail-to-rail operational amplifiers, as well as other analog and digital circuits such a mixers, ring oscillators, current mirrors, etc.

30 Claims, 6 Drawing Sheets

(56) References Cited

U.S. PATENT DOCUMENTS

| | | | |
|---|---|---|---|
| 2009/0039869 A1* | 2/2009 | Williams | 324/123 R |
| 2010/0164551 A1* | 7/2010 | Pigott et al. | 327/94 |
| 2011/0233669 A1* | 9/2011 | Harada | 257/335 |

FOREIGN PATENT DOCUMENTS

| | | | | |
|---|---|---|---|---|
| JP | 2000/040791 | | 2/2000 | |
| JP | 2002/151599 | | 5/2002 | |
| JP | 2002151599 | A * | 5/2002 | H01L 21/822 |
| JP | 2011/100857 | | 5/2011 | |
| TW | 201503373 | | 1/2015 | |

OTHER PUBLICATIONS

Response to European Extended Patent Search Report in EP Application Serial No. 14175480.4 filed Feb. 3, 2015, 13 pages.
Tawian Search Report (Office Action 1) issued in Taiwan Patent Application Serial No. 10312355 mailed Oct. 26, 2015, 7 pages.
English Translation of Taiwan Search Report (Office Action 1) issued in Taiwan Patent Application Serial No. 10312355 mailed Oct. 26, 2015, 11 pages.
OA1 issued in JP Patent Application No. 2014-145262 mailed Aug. 26, 2015, 3 pages.
English Summary of OA1 issued in JP Patent Application Serial No. 2014-145262 mailed Aug. 26, 2015, 3 pages.
Response to OA1 issued in JP Patent Application Serial No. 2014-145262 filed Feb. 26, 2016, 3 pages.
English Summary of Amended Claims in Response to OA1 issued in JP Patent Application Serial No. 2014-145262 filed Feb. 26, 2016, 2 pages.
Response to Taiwan Search Report (Office Action 1) filed on Feb. 1, 2016 in TW Patent Application Serial No. 10312355, 8 pages.
English Translations of Response to Taiwan Search Report (Office Action 1) filed on Feb. 1, 2016 in TW Patent Application Serial No. 10312355, 3 pages.
Final Rejection issued in JP Patent Application Serial No. 2014-145262 mailed Apr. 6, 2016, 2 pages.
English Translation of Final Rejection issued in JP Patent Application Serial No. 2014-145262 mailed Apr. 6, 2016, 2 pages.
Taiwan Office Action issued in TW Patent Application Serial No. 103123599 mailed Jun. 3, 2016, 5 pages.
English Summary of Taiwan Office Action issued in TW Patent Application Serial No. 103123599 mailed Jun. 3, 2016, 4 pages.

* cited by examiner

MODULAR APPROACH FOR REDUCING FLICKER NOISE OF MOSFETS

TECHNICAL FIELD OF THE DISCLOSURE

The present disclosure relates generally to reduction of flicker noise of metal-oxide-semiconductor field-effect transistors (MOSFETs) and, more particularly, to reducing noise of MOSFETS in high precision applications using a modular approach.

BACKGROUND

In high-precision analog (or mixed signal) applications, a low flicker noise (i.e., 1/f noise) for metal-oxide-semiconductor field-effect transistors (MOSFETs) is one of the important design requirements. Generally, flicker noise is attributed to the trapping and de-trapping of carriers by traps at the Si—$SiO_2$ surface.

Traditionally in older generations of complementary-metal-oxide-semiconductor (CMOS) technology prior to 0.25 um CMOS, input devices of an operation amplifier (op-amp) uses a p-channel MOSFET (PMOS), which is a buried channel device. For these type of op-amps, flicker noise is low for PMOS devices as compared to n-channel MOSFETs (NMOS, which are surface channel devices) because flicker noise is reduced by making MOSFET conduction away from the surface by having a buried channel device. When the conduction is not at the surface, the carriers in the buried channel PMOS (BCPMOS) are less impacted by trapping and de-trapping.

As CMOS technology moved through several generations of scaling below 0.25 um nodes, the BCPMOS became replaced by a surface channel PMOS (SCPMOS) as the industry move to accommodate digital applications where the issue of flicker noise is not a primary concern. However, for high precision analog (or mixed signal) applications, the high flicker noise caused by SCPMOS devices remains problematic.

OVERVIEW

The present disclosure relates generally to a method for reducing flicker noise of one or more metal-oxide semiconductor field-effect transistors (MOSFETs), the method comprises converting one or more surface channel MOSFETs to one or more buried channel MOSFETs or providing one or more surface channel MOSFETs as buried channel MOSFETs. Accordingly, the otherwise surface channel MOSFETs are adapted through this method, and the otherwise surface channel MOSFETs are fabricated as buried channel MOSFETs. According to one aspect, this method comprises selecting or identifying MOSFETs as candidates for such adaptation. For instance, an option may be selected and/or implemented for the one or more MOSFETs to adapt/convert the otherwise surface channel MOSFETs into buried channel MOSFETs.

Advantageously, the method provides a modular approach for adapting the surface channel MOSFETs into buried channel MOSFETs without changing the physical design of the MOSFET of a particular process technology. Generally, the converting step may be applied to either surface channel NMOS and/or PMOS devices being fabricated using various CMOS technologies (hence the modular approach).

Within the context of this disclosure, "low flicker noise" or "lower flicker noise" relates to having lower flicker noise in a device when compared to having a surface channel device with "high flicker noise" or "higher flicker noise." In some embodiments, the "low flicker noise" or "lower flicker noise" relates to having lower flicker noise in a device having a fixed device area, i.e., gate width W×gate length L (i.e., the device has lower 1/f noise even though the device area has not changed).

In some embodiments, the one or more surface channel MOSFETS are used at the input(s) of one or more operational amplifiers in the device. Said MOSFETs may be selected for the converting step due to its design requirement to have low flicker noise (1/f noise) at the input for high-precision analog (or mixed signal) applications. For instance, a surface channel NMOS at the input of an op-amp (which may have been placed at the input due to its speed advantages over, e.g., a buried channel PMOS, and fabricated using a range of process technologies) can be converted into a buried channel device. In another instance, a surface channel PMOS (e.g., fabricated using smaller than 0.25 micron process technology) at the input of an op-amp may be converted into a buried channel device to achieve lower flicker noise.

In some embodiments, the one or more surface channel MOSFETs are used in a rail-to-rail operational amplifier (op-amp). These MOSFETs may be selected, NMOS and/or PMOS (e.g., at a dual-input rail-to-rail op-amp), when low flicker noise is desired for the large input swing of the rail-to-rail applications. The method is particularly advantageous for 0.25 micron or greater technology, where although the PMOS is a buried device, the surface channel NMOS devices in the rail-to-rail application can be converted into a buried device to achieve a reduction in flicker noise for substantially the whole range of input swing. The method is also advantageous for devices fabricated using smaller than 0.25 micron technology, where both surface channel PMOS and NMOS devices in the rail-to-rail application can be converted into buried devices to achieve the reduction in flicker noise for substantially the whole range of input swing.

In some embodiments, the one or more surface channel MOSFETs could have their source connected to power supply of operational amplifier (op-amp). These MOSFETs may be selected for reducing 1/f noise. The method is particularly advantageous for 0.25 micron or greater technology, where although the PMOS is a buried device, the surface channel NMOS devices in the rail-to-rail application can be converted into a buried device to achieve a reduction in flicker noise for substantially the whole range of input swing. The method is also advantageous for devices fabricated using smaller than 0.25 micron technology, where both surface channel PMOS and NMOS devices in the rail-to-rail application can be converted into buried devices to achieve the reduction in flicker noise for substantially the whole range of input swing.

According to one aspect, converting the one or more MOSFETS from one or more surface channel MOSFETs to one or more buried channel MOSFETs comprise applying one or more masks (in some cases, only a single mask) to provide a counter-doped implant to the channel(s) of the one or more surface channel MOSFETs. The mask may be available as an option to providing an otherwise surface channel MOSFET without an implant. An implant is provided where ever a buried channel device is desired. To convert a surface channel device to a buried channel device, one mask and one implant may be used. For instance, in a standard CMOS Technology, e.g., 0.18 um CMOS, the mask and implant may be classified as optional mask for reducing 1/f noise.

The application of a mask onto existing MOSFET designs provides a modular approach which can be applied, e.g., by a supplier, onto both PMOS and NMOS devices that are being fabricated using various technologies. The mask allows implants to be placed in selected MOSFETs, and advantageously provides the result of reducing flicker noise wherever needed in a chip/device.

According to one aspect, if the surface channel MOSFETs comprises a surface channel p-channel MOSFET (PMOS), the counter-doped implant comprises a Boron (B) or Boron Difluoride (BF2) implant to the channel of the surface channel p-MOSFET. According to another aspect, if the surface channel MOSFETs comprises a surface channel n-channel MOSFET, the counter-doped implant comprises a Phosphorous (P) or Arsenic (As) implant to the channel of the surface channel NMOS.

In some embodiments, the device is fabricated using 0.25 micron or larger process technology, where the one or more surface channel devices comprises n-channel MOSFET(s). PMOS devices fabricated using said process technology are already buried channel devices, thus only surface channel NMOS devices are available for conversion into a buried channel device.

In some embodiments, the device is fabricated using smaller than 0.25 micron process technology, where the one or more surface channel devices comprises p-type gate electrode p-channel MOSFET(s) and/or n-type gate electrode n-channel MOSFET(s). In such technology, both PMOS and NMOS devices are surface channel devices, and thus either types of devices are available for selection and conversion into buried channel devices.

It is noted that such a modular method is particularly advantageous in analog (or mixed signal) circuits where flicker noise is very undesirable, and in some cases, in situations where changing the actual design of the circuit/chip is not practical or desired. For instance, the device may be an op-amp for amplifying an analog signal, where the effect of flicker noise is very undesirable. This issue of flicker noise may be even more relevant in a high-precision analog circuit. The only technique that allows for decreasing flicker noise, requires an increase in the transistor size. While sometimes this is possible, in other cases this is not possible due to area and/or speed performance implications.

A device adapted to reduce flicker noise of one or more metal-oxide semiconductor field-effect transistors (MOSFETs) is also disclosed. The device is adapted using any of the methods disclosed herein. The device may include one or more surface channel MOSFETs selected for conversion to one or more buried channel MOSFETs. In some cases, the one or more MOSFETs are selected as candidates where low flicker noise is desired, and/or an option is elected to provide buried channel device(s) instead of the surface channel device(s). One or more masks are applied to the channel(s) of the one or more surface channel MOSFETs to convert/adapt the one or more (otherwise) surface channel MOSFETs into the one or more buried channel MOSFETs, wherein the one or more masks provides a counter-doped implant to the channel(s).

A rail-to-rail operational amplifier adapted have a reduction in flicker noise is also disclosed. The op-amp may include one or more surface channel metal-oxide semiconductor field-effect transistors (MOSFETs) selected for conversion to one or more buried channel MOSFETs, and one or more masks applied to the channel(s) of the one or more surface channel MOSFETs to convert the one or more surface channel MOSFETs into the one or more buried channel MOSFETs, wherein the one or more masks provides a counter-doped implant to the channel(s).

Other applications besides the rail-to-rail amplifier are envisioned. For instance, the application of the methods and devices disclosed herein may include one or more of the following: a current mirror, a ring oscillator, a radio frequency (RF) mixer, and an LC oscillator.

DETAILED DESCRIPTION OF EXAMPLE EMBODIMENTS OF THE DISCLOSURE

To reduce flicker noise of metal-oxide-semiconductor field-effect transistors (MOSFETs), a modular approach which is applicable to both n-channel MOSFETs (NMOS) and p-MOSFETs (PMOS) of various process technologies is discussed herein. Specifically, one or more masks may be applied to provide a counter-doping implant to NMOS and/or PMOS devices to convert them from surface channel devices to buried channel devices.

In 0.25 micron or larger process technologies, typically only the p-channel MOSFET (PMOS) devices are buried channel MOSFETS while n-channel MOSFET (NMOS) devices are surface channel MOSFETs, because the technology uses n+ poly for both PMOS and NMOS devices. For an operational amplifier (op-amp), using a buried channel PMOS at its input may reduce flicker noise (i.e., 1/f noise). However, for (dual input) rail-to-rail op-amps, flicker noise ought to be reduced for the whole input signal swing. This implies that in addition to reducing the flicker noise of the PMOS device(s), the flicker noise of NMOS devices(s) should also be reduced. The scenario is described in further detail in relation to FIG. 3. For such applications (and many others), the NMOS devices may be converted into buried channel MOSFETs using the modular approach.

In 0.25 or smaller (newer) process technologies, such as 0.18 micron technologies, both PMOS and NMOS devices are surface channel MOSFETs. Thus, the issue of flicker noise is even more relevant in the newer process technologies if the devices are to be used in precision analog (or mixed signal) applications. Both PMOS and NMOS devices may be converted into buried channel MOSFETs using the modular approach. Even though flicker noise is increased according to the device when its size decreases, the modular approach provide a way to reduce flicker noise while utilizing the benefits of the newer process technologies.

Figure 1A:
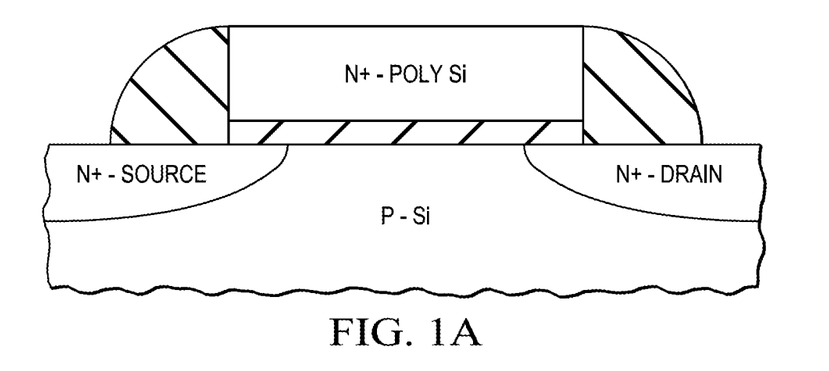
FIGS. 1A-1B are simplified diagrams illustrating a surface channel NMOS device versus a buried channel NMOS device, according to one embodiment of the disclosure.
Figure 1B:
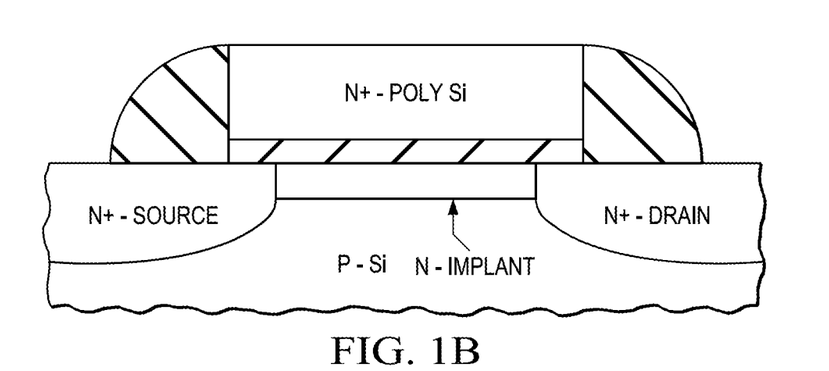

FIG. 1A illustrates a surface channel NMOS device, which exhibits a high flicker noise (i.e. 1/f noise). FIG. 1B illustrates a buried channel NMOS device according to one embodiment of the disclosure. The buried channel NMOS in FIG. 1B is created by converting/adapting/augmenting the surface channel NMOS in FIG. 1A by applying one or more masks to provide a counter-doped implant to the channel of the NMOS (indicated as "N-Implant" in the diagram).

Figure 2A:
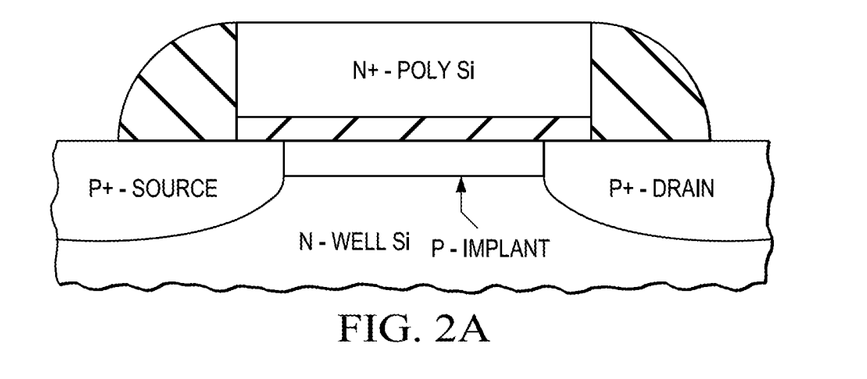
FIGS. 2A-2C are simplified diagrams illustrating a surface channel PMOS device versus buried channel PMOS devices, according to one embodiment of the disclosure.
Figure 2B:
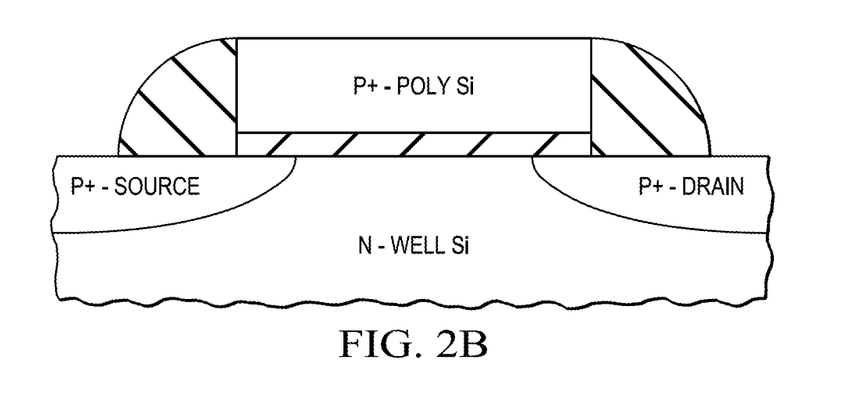
Figure 2C:
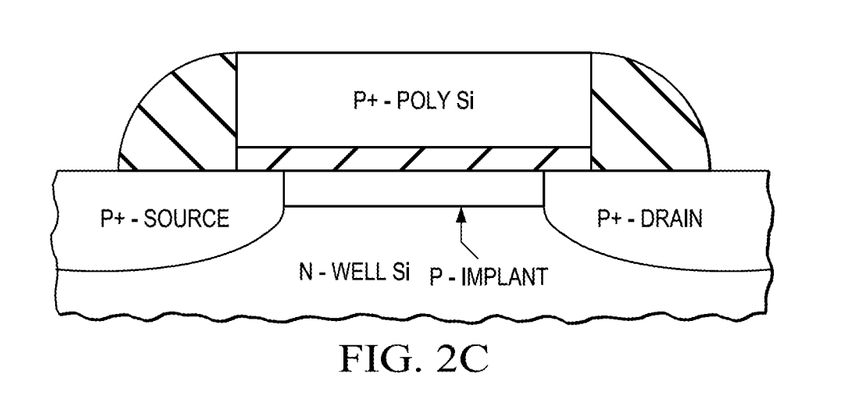

FIG. 2A illustrates a buried channel PMOS with an n-type gate electrode PMOS design (N+ poly gate), typically used in 0.25 micron or greater process technology. Due to its buried channel design, the flicker noise is low, as compared to surface channel devices. FIG. 2B illustrates a surface channel PMOS device (with P+ poly gate), such as ones used in smaller than 0.25 micron process technology (e.g., 0.18 micron process technology), which has replaced the buried channel PMOS as seen in FIG. 2A. The surface channel PMOS exhibits higher flicker noise when compared to the buried channel PMOS design seen in FIG. 2A. To address the issue of flicker noise, one or more masks is applied to the surface channel PMOS to convert/adapt/augment the surface channel PMOS (P+ poly gate) in FIG. 2B to provide a counter-doped implant to the channel of the PMOS (indicated as "P-Implant" in the diagram, shown in FIG. 2C).

Typically, a designer would not try to increase the gate length L to compensate for higher leakage, because a longer gate length L often causes a reduction in speed and more parasitic effects. These may be undesirable effects in both digital and analog applications.

Increasing channel length is not always possible in a mixed-signal design. There are some design/application specific situations when this is desirable for increasing output impedance of device at expenses of speed reduction. However, in general increasing L is considered a loss in performances, it is "equivalent" to working in older technology.

For instance, a high-precision low speed analog design may be able to use this technique. Furthermore, the bias current is typically many orders of magnitude greater than the leakage present in the buried channel devices. Therefore, the leakage is rarely a problem in analog (or mixed signal) applications. Moreover, the input device of an op-amp will not experience the whole supply voltage (i.e., $V_{dd}$), thus, the device operation may be limited to a lower limit (wherein the limit may be empirically determined or simulated). Although flicker noise is a function of area (i.e., gate width W×gate length L), for the same area, a buried channel device offers a lower flicker noise compared to a surface channel device.

A modular approach is particularly useful because the surface channel devices can be converted into buried channel devices or provided/fabricated as buried channel devices without impacting the other MOSFETs devices of underlying technology. Although the use of a mask may increase the cost of the device, the modular approach provides a way for a circuit designer to reduce flicker noise by selecting MOSFETs in a circuit, and apply the mask (e.g., as an option) to-add implants for the selected MOSFETs to achieve reduced flicker noise for the particular analog (or mixed) signal applications. The circuit designer may elect the option to use a buried channel device instead of a surface channel device within a circuit (e.g., choosing/identifying a surface channel MOSFET where lower flicker noise is desired), and the supplier of the device may be requested to apply an additional mask to the device to provide appropriate implants to the selected MOSFETs.

Figure 3:
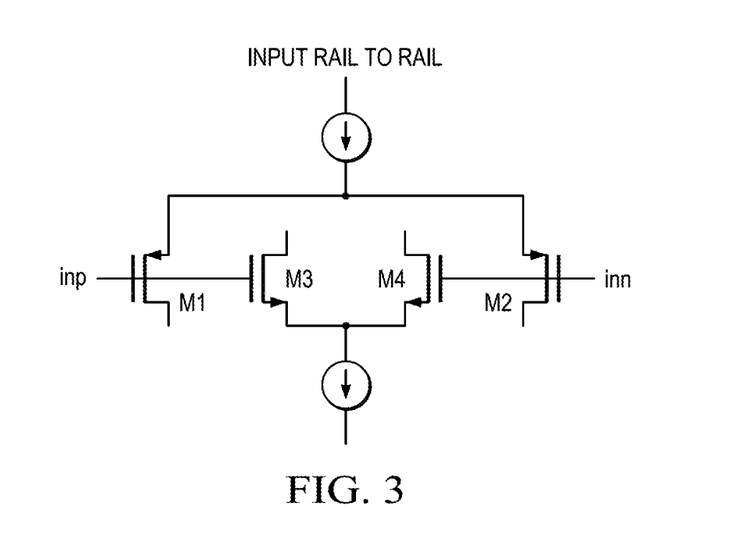
FIG. 3 is a simplified circuit diagram illustrating a dual input rail-to-rail operational amplifier, according to some embodiments of the disclosure.

FIG. 3 illustrates a simplified circuit diagram illustrating a (dual input) rail-to-rail operational amplifier, according to some embodiments of the disclosure. The dual input op-amp comprises two PMOS devices (indicated as "M1" and "M2"), and two NMOS devices (indicated as "M3" and "M4"). In such a rail-to-rail application, flicker noise ought to be reduced when PMOS devices are on, and also when the NMOS devices are on. For a range of voltages when the PMOS is on and for the range of voltages when the NMOS is on, flicker noise is an issue for the large range of input swing that the op-amp supports. For smaller than 0.25 micron process technologies, the modular approach can select the surface channel PMOS and NMOS devices and apply the mask to provide implants for both surface channel PMOS devices and NMOS devices. For 0.25 or greater process technologies, the modular approach can select the surface channel NMOS devices and apply the mask to surface channel NMOS devices (there is no need to apply the mask to buried channel PMOS devices).

Although the modular approach is particularly suitable for the rail-to-rail applications where PMOS and/or NMOS devices may be converted to or provided as buried channel devices, the modular approach is also suitable for other applications. For instance, any op-amps uses an NMOS device (instead of the typical choice of using a buried channel PMOS device in 0.25 or greater technologies) because a NMOS device is faster than a PMOS device. When the NMOS device is a surface channel MOSFET, the modular approach is also suitable in reducing flicker noise by applying the mask to the input surface channel NMOS device.

Figure 4:
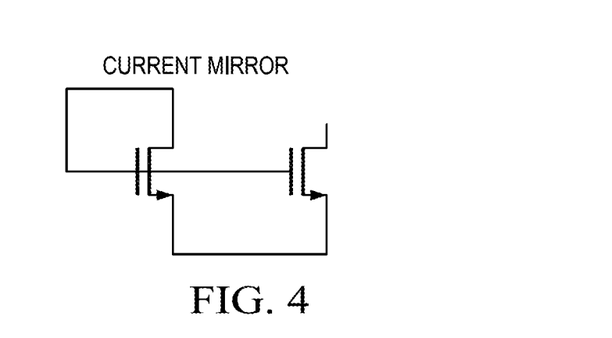
FIG. 4 is a simplified circuit diagram illustrating a current mirror, according to some embodiments of the disclosure.

FIG. 4 is a simplified circuit diagram illustrating a current mirror, according to some embodiments of the disclosure. One or more surface channel MOSFETs in the current mirror may be candidates for the disclosed method. Buried channel MOSFETs may be provided in place of surface channel MOSFETs, especially when (simply) increasing the gate length L is not practical or desirable.

Figure 5:
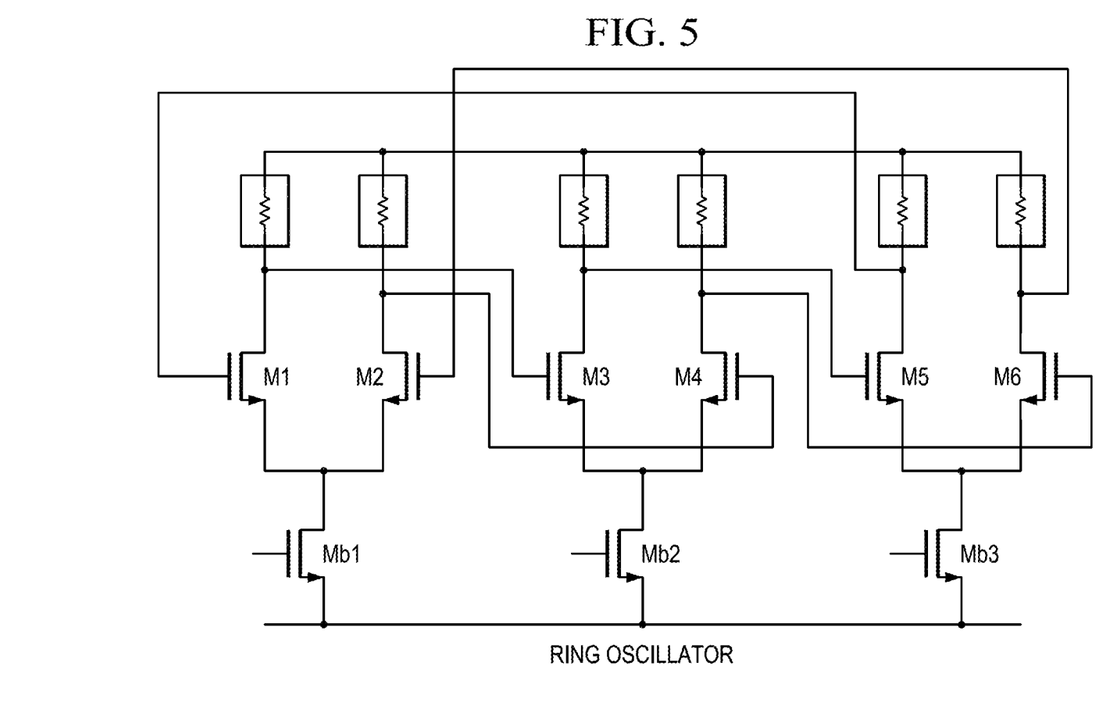
FIG. 5 is a simplified circuit diagram illustrating a ring oscillator, according to some embodiments of the disclosure.

FIG. 5 is a simplified circuit diagram illustrating a ring oscillator, according to some embodiments of the disclosure. Used in many analog and digital circuits, the ring oscillator is a basic block for serial link connections as part of PLL and Click Data Recovery. The ring oscillator comprises a plurality of MOSFETs (such as M1, M2, M3, M4, M5, M6, M7, Mb1, Mb2, Mb3). One or more of the MOSFETs, such as M1-M6, may be provided as buried channel device(s) instead of surface channel device(s) using the approaches disclosed herein. For instance, all of M1-M6 may be selected as candidates. In some embodiments, additionally or in combination, one or more of the MOSFETs Mb1-Mb3 may be provided as buried channel device(s) instead of surface channel device(s). For instance, all of Mb1-Mb3 may be selected as candidates.

Figure 6:
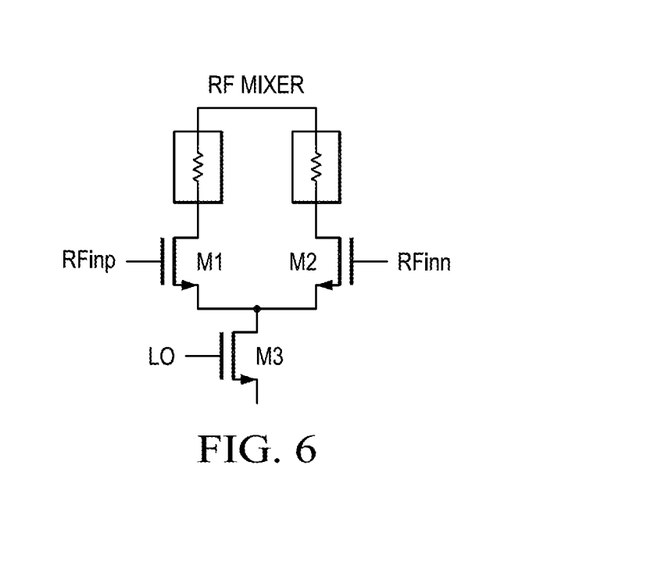
FIG. 6 is a simplified circuit diagram illustrating an RF mixer, according to some embodiments of the disclosure.

FIG. 6 is a simplified circuit diagram illustrating a radio frequency (RF) mixer, according to some embodiments of the disclosure. In such an application, the RF mixer may comprises a plurality of MOSFETs, such as M1, M2, and M3. In particular, the MOSFET, which receives the RF signal, is a MOSFET may be a source of flicker noise. The signal and the flicker noise may be mixed with the local oscillator and may show up at higher or lower frequencies depending on whether the mixer is in an up-converting or down-converting block. The modular approach for providing an implant is particular advantageous for reducing flicker noise because (simply) increasing the gate length L is not an option.

Figure 7:
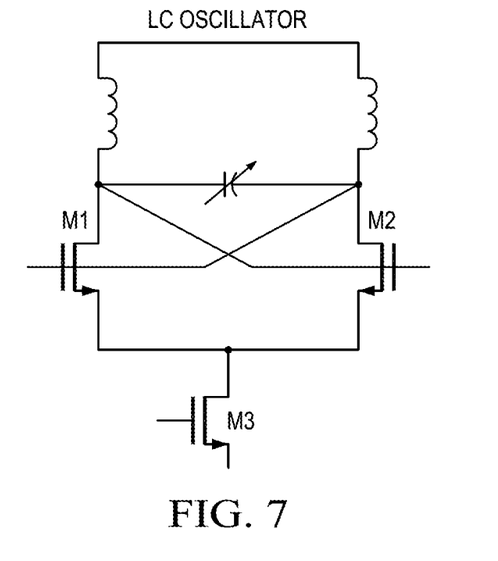
FIG. 7 is a simplified circuit diagram illustrating an LC oscillator, according to some embodiments of the disclosure.

FIG. 7 is a simplified circuit diagram illustrating an LC oscillator, according to some embodiments of the disclosure. In such an LC oscillator, flicker noise is typically related to phase noise. While it may be possible to increase gate length L of M3 because it is a bias device, it may not be practical to increase the gate length L for M1 and M2 because designs generally require M1 and M2 to be short channel devices for speed reasons. Accordingly, M1 and M2 may make particularly suitable candidates for the modular approach in reducing flicker noise in those devices. Furthermore, it is also possible to additionally apply the modular approach to M3 to reduce flicker noise in M3, if desired, especially when the current in M3 is generally high.

Figure 8:
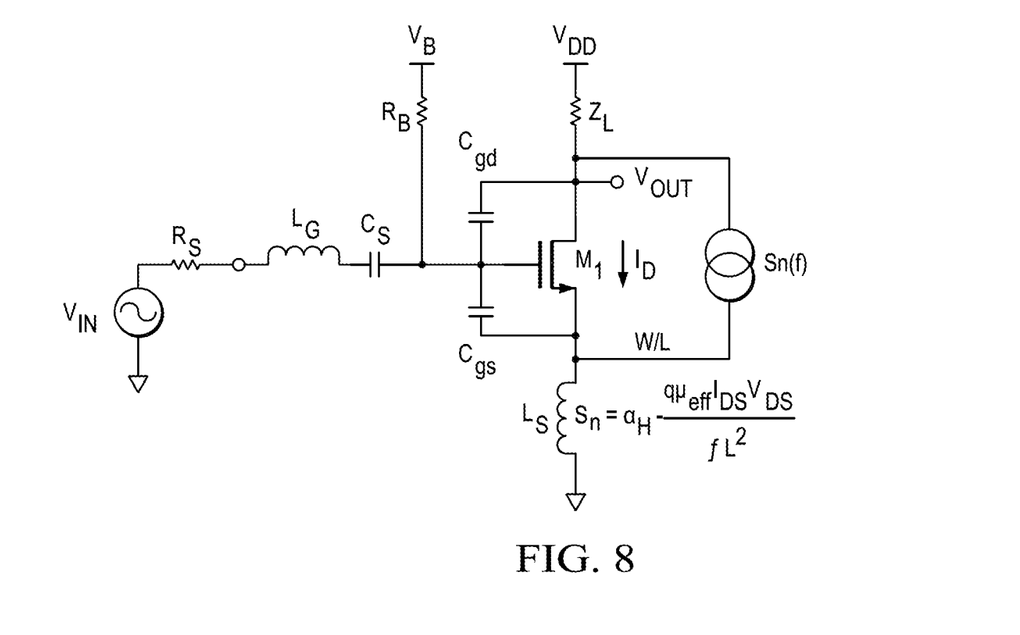
FIG. 8 is a simplified circuit diagram illustrating a low noise amplifier, according to some embodiments of the disclosure.

FIG. 8 is a simplified circuit diagram illustrating a low noise amplifier, according to some embodiments of the disclosure. A low noise amplifier is a common block for an RF receiver, usually provided as a block before a mixer (e.g., the RF mixer seen in FIG. 6). Typically, a low noise amplifier comprises very few components, and usually includes a MOSFET M1, as seen in the scheme illustrated in FIG. 8. In this scheme, any noise from M1, more specifically $S_n(f)$, would be transferred to the output $V_{out}$. The equation for noise spectrum $S_n(f)$ may be represented by the Hooge's law for flicker noise (or 1/f noise). In the equation for $S_n(f)$, the parameter $\alpha_H$ is a purely technology dependent parameter. By using the modular approach discussed herein, the parameter may be manipulated to decrease flicker noise by providing the implant at M1 such that a buried channel device is provided instead of a surface channel device.

Figures 9, 10:
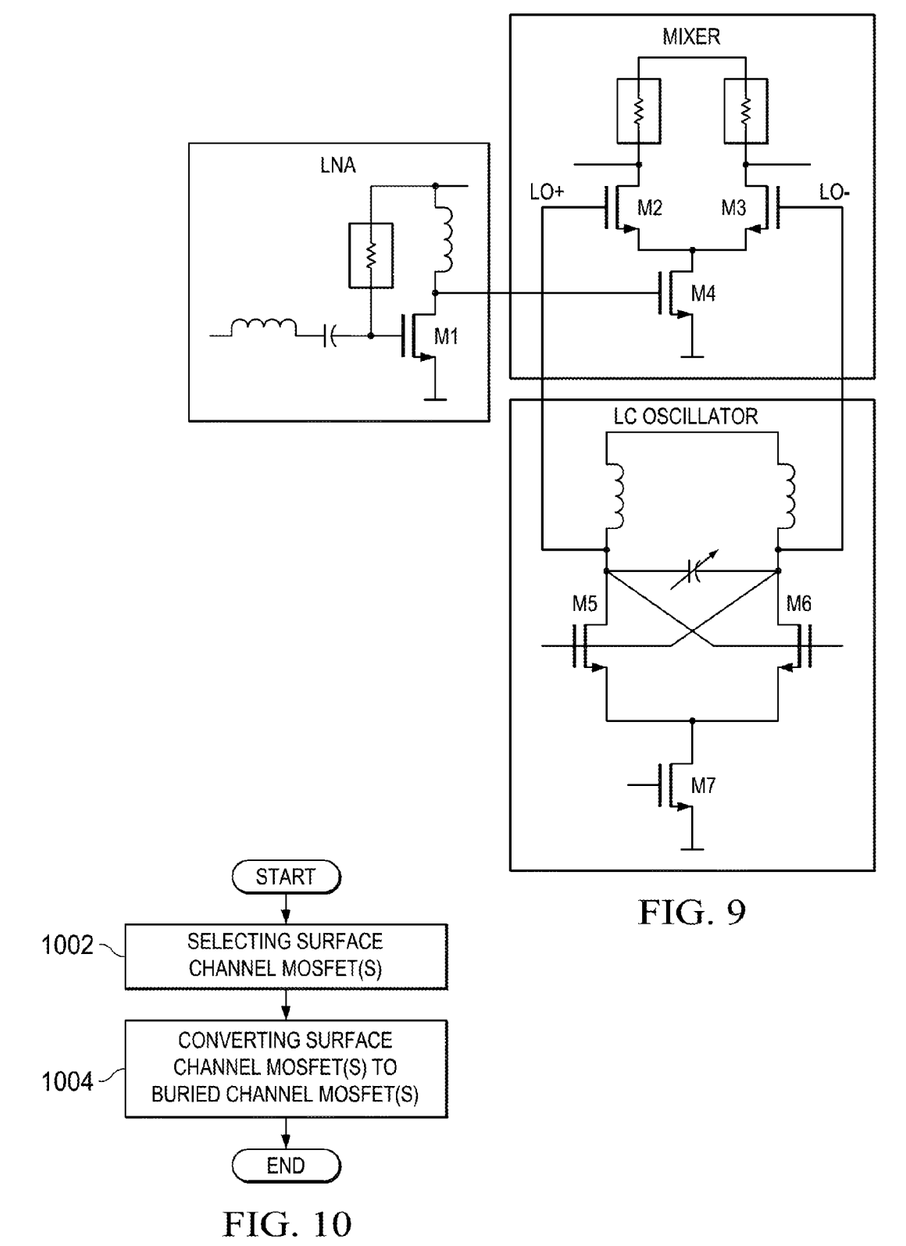
FIG. 9 is a simplified circuit diagram illustrating a radio frequency (RF) application, according to some embodiments of the disclosure.
FIG. 10 is a flow diagram illustrating the modular approach for reducing flicker noise, according to one embodiment of the disclosure.

FIG. 9 is a simplified circuit diagram illustrating a radio frequency (RF) application, according to some embodiments of the disclosure. The low noise amplifier, e.g., as seen in FIG. 8, the RF mixer, e.g., as seen in FIG. 6, and the LC oscillator, e.g., as seen in FIG. 7, may be coupled together to form an RF Application. In one embodiment, surface channel MOSFETs M1, M2, M3, M5, and M6 may be selected as candidates for the modular approach. In particular, buried channel MOSFETs may be provided instead of surface channel devices by applying a mask, which provides an implant to each of M1, M2, M3, M5, and M6 to reduce flicker noise in the RF application as shown in FIG. 9.

FIG. 10 is a flow diagram illustrating the modular approach for reducing flicker noise, according to one embodiment of the disclosure. The modular approach may be performed to adapt a device to reduce flicker noise without modifying the underlying fabrication process for making the device. At step 1002, one or more surface channel MOSFETs in a device may be selected or identified. For instance, surface channel MOSFETs may be identified based on a circuit design of the device, wherever a low flicker noise (i.e., 1/f noise) is desired. In some embodiments, a circuit designer may be provided with an option to adapt the otherwise surface channel MOSFET(s), or elects to use the version of the circuit which provides buried channel MOSFET(s) instead of the surface channel MOSFET(s) without changing the underlying fabrication technology.

The one or more surface channel MOSFETs may be used at the input(s) of one or more operational amplifiers (op-amps) in the device. For instance, if a surface channel NMOS is used at the input and a low flicker noise is desired, the NMOS may be selected to be converted to buried channel NMOS. In some cases, the one or more surface channel MOSFETs, NMOS and/or PMOS devices, may be used in at least a part of or the entire (dual input) rail-to-rail application, such as a rail-to-rail op-amp, where a low flicker noise is desired throughout at least a part of or the entire rail-to-rail application. The one or more surface channel MOSFETs, or the particular block or section having the one or more surface channel MOSFETs is identified or selected as candidate for providing one or more buried channel MOSFETs instead of the one or more surface channel MOSFETs.

Upon determining that the option is elected for the selected MOSFETs, the fabrication process would convert it/them into buried channel MOSFET(s), e.g., by applying a mask and an implant. In step 1004, the selected surface channel MOSFET(s) are converted/adapted into buried channel MOSFET(s) or provided as buried channel MOSFET(s). The conversion occurs without having to modify the existing process technology. In a way, the modular approach allows the existing MOSFETs to be adapted to achieve a reduction in flicker noise without having to change the physical design of the MOSFET itself for a particular process technology. The one or more surface channel MOSFETS are converted into a buried channel MOSFET by applying one or more masks (at the supplier) to provide an implant to the channel(s) of the one or more surface channel MOSFETs. The mask enables a counter-doped implant to be deposited at the channel of the one or more surface channel MOSFET to convert the surface channel MOSFETs into buried channel MOSFETs. As a result, the physics of the implant allows the (converted) MOSFET to operate with reduced flicker noise.

Some designers may opt to use a chopper amplifier as an architectural solution (rather than a technology solution that the modular approach provides) to reduce flicker noise. However, it is noted that the modular approach has several advantages over the chopper amplifier. Typically, a chopper amplifier may reduce the flicker noise of a given process technology. However, chopping does not necessarily fix the problem. In fact, chopping merely moves the DC component of the flicker noise to higher frequencies, and after chopping and filtering, the chopper modulates the signal back to the baseband. Flicker noise typically resides in the low frequencies, but there is still energy in other frequencies. Thus, the chopper amplifier does not reduce all the energy of the flicker noise. Furthermore, the chopper amplifier does not allow the entire bandwidth because some of the bandwidth is dedicated to perform the chopping and filtering. The architectural solution increases complexity of the circuit, may require internal or external clock, and increase the die area. It is even possible to apply the modular approach to the MOSFETs of the chopper amplifier to reduce the flicker noise.

One skilled in the art would appreciate that the doses and energies of the implants may be optimized through routine testing, such as by Technology Computer Aided Design (TCAD) simulation and/or by implementing physical experiments using silicon in a laboratory.

In the discussions of the embodiments above, amplifiers, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, any number of electrical devices and/or circuits of the FIGURES may be used in a board of an associated electronic device. In particular, the associated electronic device may be used in a high-precision analog (or mixed) signal application. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the amplification functionalities may be implemented in one or more silicon cores in Application Specific Integrated Circuits (ASICs), Field Programmable Gate Arrays (FPGAs), and other semiconductor chips. The one or more masks disclosed herein for converting surface channel MOSFETs to buried channel MOSFETs, due to the modular nature of the approach, may be applied to SOC packages or MCM packages independent of the process technology.

It is also imperative to note that any of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that the activities discussed above with reference to the FIGURES are applicable to any integrated circuits that involve, e.g., high-precision analog (or mixed signal) applications. In some cases, the integrated circuits may involve digital signal processing, particularly those that can execute specialized software programs, or algorithms, some of which may be associated with processing digitized real-time data associated with high-precision analog (or mixed signal) applications. Certain embodiments can relate to multi-DSP signal processing, floating point processing, signal/control processing, fixed-function processing, microcontroller applications, etc.

In certain contexts, the features discussed herein can be applicable to various high-precision analog (or mixed signal) applications related to medical systems, scientific instrumentation, wireless and wired communications, radar, industrial process control, audio and video equipment, current sensing, instrumentation (which can be highly precise), and other possible digital-processing-based systems. Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment, and interior applications of any kind). Furthermore, powertrain systems (for example, in hybrid and electric vehicles) can use high-precision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Note that all optional features of the apparatus described above may also be implemented with respect to the method or process described herein and specifics in the examples may be used anywhere in one or more embodiments. In a first example, a system is provided (that can include any suitable circuitry, dividers, capacitors, resistors, inductors, ADCs, DFFs, logic gates, software, hardware, links, etc.) that can be part of any type of computer, which can further include a circuit board coupled to a plurality of electronic components. The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

What is claimed is:

1. A device adapted to reduce flicker noise of one or more metal-oxide semiconductor field-effect transistors (MOSFETs), the device comprising:
    one or more buried channel MOSFETs at an input of the device, the device being an operational amplifier, wherein
    the one or more buried channel MOSFETs include
        an n-type well;
        a p-type source in the n-type well;
        a p-type drain in the n-type well;
        a channel that extends between the p-type source and the p-type drain and includes a counter-doped implant, the counter-doped implant being p-type; and
        a p-type polysilicon gate above the counter-doped implant.

2. The device of claim 1, wherein the device is a rail-to-rail operational amplifier.

3. The device of claim 1, wherein the counter-doped implant comprises a Boron (B) or Boron Difluoride (BF$_2$) implant.

4. The device of claim 1, wherein another of the one or more buried channel MOSFETs includes a counter-doped implant that comprises a Phosphorous (P) or Arsenic (As) implant to a channel of the another of the one or more buried channel MOSFETs.

5. The device of claim 1, wherein:
    the device is fabricated using 0.25 micron or larger process technology; and
    another of the one or more buried channel MOSFETs comprises n-channel MOSFET(s).

6. The device of claim 1, wherein:
    the device is fabricated using smaller than 0.25 micron process technology.

7. A rail-to-rail operational amplifier adapted to have a reduction in flicker noise, said operational amplifier comprising:
    one or more buried channel MOSFETs at a first input of the operational amplifier, wherein
    the one or more buried channel MOSFETs include
        an n-type well;
        a p-type source in the n-type well;
        a p-type drain in the n-type well;
        a channel that extends between the p-type source and the p-type drain and includes a counter-doped implant, the counter-doped implant being p-type; and
        a p-type polysilicon gate above the counter-doped implant.

8. The operational amplifier of claim 7, wherein the one or more buried channel MOSFETs is fabricated using 0.25 micron or larger process technology.

9. The operational amplifier of claim 8, wherein another of the one or more buried channel MOSFETs comprises an n-channel MOSFET.

10. The operational amplifier of claim 7, wherein the one or more buried channel MOSFETs is fabricated using smaller than 0.25 micron process technology.

11. The operational amplifier of claim 7, further comprising:
    a second input including one or more additional buried channel MOSFETs, wherein a channel of the one or more additional buried channel MOSFETs includes a counter-doped implant, and the one or more additional buried channel MOSFETs includes an NMOS device.

12. A method for manufacturing a device adapted to reduce flicker noise of one or more metal-oxide semiconductor field-effect transistors (MOSFETs), the method comprising:
    implanting, into an n-type well, a counter-doped implant to form a channel that extends between a p-type source and a p-type drain, the n-type well including the p-type source and the p-type drain, the counter-doped implant being p-type; and
    forming a p-type polysilicon gate above the counter-doped implant to provide a buried channel MOSFET at an input of an operational amplifier.

13. The method of claim 12, wherein the operational amplifier is a rail-to-rail operational amplifier.

14. The method of claim 12, wherein the implanting the counter-doped implant comprises implanting Boron (B) or Boron Difluoride (BF$_2$).

15. The method of claim 12, further comprising:
    implanting Phosphorous (P) or Arsenic (As) to a channel of another buried channel MOSFET.

16. The method of claim 12, further comprising:
    fabricating the buried channel MOSFET using 0.25 micron or larger process technology.

17. The method of claim 16, further comprising:
    fabricating another buried channel MOSFET that comprises an n-channel MOSFET.

18. The method of claim 12, further comprising:
    fabricating the buried channel MOSFET using smaller than 0.25 micron process technology.

19. A device adapted to reduce flicker noise of one or more metal-oxide semiconductor field-effect transistors (MOSFETs), the device comprising:
    one or more buried channel MOSFETs at an input of the device, the device being an operational amplifier, wherein
the one or more buried channel MOSFETs include
    a p-type well;
    an n-type source in the p-type well;
    an n-type drain in the p-type well;
    a channel that extends between the n-type source and the n-type drain and includes a counter-doped implant, the counter-doped implant being n-type; and
    an n-type polysilicon gate above the counter-doped implant.

20. The device of claim 19, wherein the operational amplifier is a rail-to-rail operational amplifier.

21. The device of claim 19, wherein another of the one or more buried channel MOSFETs includes a counter-doped implant that comprises a Boron (B) or Boron Difluoride ($BF_2$) implant to a channel of the another of the one or more buried channel MOSFETs.

22. The device of claim 19, wherein the counter-doped implant comprises a Phosphorous (P) or Arsenic (As) implant.

23. The device of claim 19, wherein:
    the device is fabricated using 0.25 micron or larger process technology.

24. The device of claim 19, wherein:
    the device is fabricated using smaller than 0.25 micron process technology.

25. A method for manufacturing a device adapted to reduce flicker noise of one or more metal-oxide semiconductor field-effect transistors (MOSFETs), the method comprising:
    implanting, into a p-type well, a counter-doped implant to form a channel that extends between an n-type source and an n-type drain, the p-type well including the n-type source and the n-type drain, the counter-doped implant being n-type; and
    forming an n-type polysilicon gate above the counter-doped implant to provide a buried channel MOSFET at an input of an operational amplifier.

26. The method of claim 25, wherein the operational amplifier is a rail-to-rail operational amplifier.

27. The method of claim 25, further comprising:
    implanting Boron (B) or Boron Difluoride ($BF_2$) to a channel of another buried channel MOSFET.

28. The method of claim 25, wherein the implanting the counter-doped implant comprises implanting Phosphorous (P) or Arsenic (As).

29. The method of claim 25, further comprising:
    fabricating the buried channel MOSFET using 0.25 micron or larger process technology.

30. The method of claim 25, further comprising:
    fabricating the buried channel MOSFET using smaller than 0.25 micron process technology.

* * * * *